US012751005B2

(12) United States Patent
Wang

(10) Patent No.: US 12,751,005 B2
(45) Date of Patent: Sep. 29, 2026

(54) MEMORY DEVICE AND METHOD FOR FORMING THE SAME

(71) Applicant: Winbond Electronics Corp., Taichung City (TW)

(72) Inventor: Chung-Hsuan Wang, Taichung City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 356 days.

(21) Appl. No.: 18/422,696

(22) Filed: Jan. 25, 2024

(65) Prior Publication Data

US 2025/0142818 A1 May 1, 2025

(30) Foreign Application Priority Data

Oct. 25, 2023 (TW) ................................ 112140770

(51) Int. Cl.
*H10B 41/30* (2023.01)

(52) U.S. Cl.
CPC .................................... *H10B 41/30* (2023.02)

(58) Field of Classification Search
CPC ........ H10B 41/30; H10B 41/40; H10B 41/46; H10B 10/00; H10B 10/12; H10B 10/125; H10B 10/15; H10B 41/20; H10B 69/00; H10D 30/6894; H10D 64/035; H10D 64/685; H10D 84/038; H10W 42/121
USPC .......................... 257/315; 438/201, 211, 257
See application file for complete search history.

(56) References Cited

U.S. PATENT DOCUMENTS

| | | | | |
|---|---|---|---|---|
| 6,524,928 B1 | 2/2003 | Hirabayashi | | |
| 8,053,848 B2 | 11/2011 | Lee et al. | | |
| 8,525,273 B2 | 9/2013 | Kwon et al. | | |
| 2007/0273030 A1* | 11/2007 | Yi | H10D 84/038 | 257/E21.679 |
| 2009/0230457 A1* | 9/2009 | Lee | H10B 43/40 | 257/E27.06 |
| 2016/0133637 A1 | 5/2016 | Wu et al. | | |
| 2017/0053928 A1 | 2/2017 | Hsaio et al. | | |
| 2018/0182747 A1* | 6/2018 | Kim | H10D 89/60 | |
| 2022/0059556 A1* | 2/2022 | Jen | H10B 41/46 | |

FOREIGN PATENT DOCUMENTS

TW 202141638 A 11/2021

* cited by examiner

*Primary Examiner* — Didarul A Mazumder
(74) *Attorney, Agent, or Firm* — MUNCY, GEISSLER, OLDS & LOWE, P.C.

(57) ABSTRACT

A memory device includes a substrate, an isolation structure, a first transistor, a second transistor, a first guard ring, and a dielectric guard ring. The substrate has a first region and a second region which are adjacent. The isolation structure is embedded in the substrate. The first transistor is disposed over the first region of the substrate and has a first conductivity type. The second transistor is disposed over the second region of the substrate and has a second conductivity type which is different from the first conductivity type. The first guard ring is disposed over the first region of the substrate and surrounds the first transistor. The first guard ring includes the same material as the first transistor and has the first conductivity type. The dielectric guard ring is disposed over the substrate and surrounds the first guard ring.

10 Claims, 6 Drawing Sheets

MEMORY DEVICE AND METHOD FOR FORMING THE SAME

CROSS REFERENCE TO RELATED APPLICATIONS

This application claims priority of Taiwan Patent Application No. 112140770, filed on Oct. 25, 2023, the entirety of which is incorporated by reference herein.

BACKGROUND OF THE INVENTION

Field of the Invention

The present invention relates to semiconductor manufacturing, and, in particular, to memory devices and methods for forming the same.

Description of the Related Art

As semiconductor devices become smaller in size, the difficulty of manufacturing these semiconductor devices has increased significantly. Unwanted defects may occur during the process of manufacturing the semiconductor devices, and these defects may cause the devices to become damaged, and their level of performance to be reduced. Therefore, there is a need to continuously improve semiconductor devices to increase their yield and improve the process window.

BRIEF SUMMARY OF THE INVENTION

The present invention provides a memory device. The memory device includes a substrate, an isolation structure, a first transistor, a second transistor, a first guard ring, and a dielectric guard ring. The substrate has a first region and a second region which are adjacent. The isolation structure is embedded in the substrate. The first transistor is disposed over the first region of the substrate and has a first conductivity type. The second transistor is disposed over the second region of the substrate and has a second conductivity type which is different from the first conductivity type. The first guard ring is disposed over the first region of the substrate and surrounds the first transistor. The first guard ring includes the same material as the first transistor and has the first conductivity type. The dielectric guard ring is disposed over the substrate and surrounds the first guard ring.

The present invention provides a method for forming a memory device. The method includes forming a gate material layer having a first conductivity type over a first region and a second region of a substrate. The method includes masking the gate material layer over the first region of the substrate and implanting the gate material layer over the second region of the substrate, such that the gate material layer over the second region has a second conductivity type which is different from the first conductivity type. The method includes forming a trench in the gate material layer over an interface between the first region and the second region. The method includes performing a heat treatment after forming the trench. The method includes after the heat treatment, etching the gate material layer on opposite sides of the trench to form a first transistor over the first region and a second transistor over the second region.

DETAILED DESCRIPTION OF THE INVENTION

The following describes a memory device and a method of forming the same according to some embodiments of the present disclosure, and is particularly applicable to flash memory devices. The memory device according to the embodiment of the present disclosure includes a dielectric guard ring, which can separate transistors with different conductivity types to avoid defects caused by subsequent heat treatment, thereby improving gate stability.

FIGS. 1A-1D are cross-sectional views illustrating various stages of forming a memory device 100 according to some embodiments of the present disclosure. Additional features may be added to the memory device 100. Some of the features described below may be replaced or eliminated for different embodiments. To simplify the figures, only a portion of the memory device 100 is illustrated.

Figure 1A:
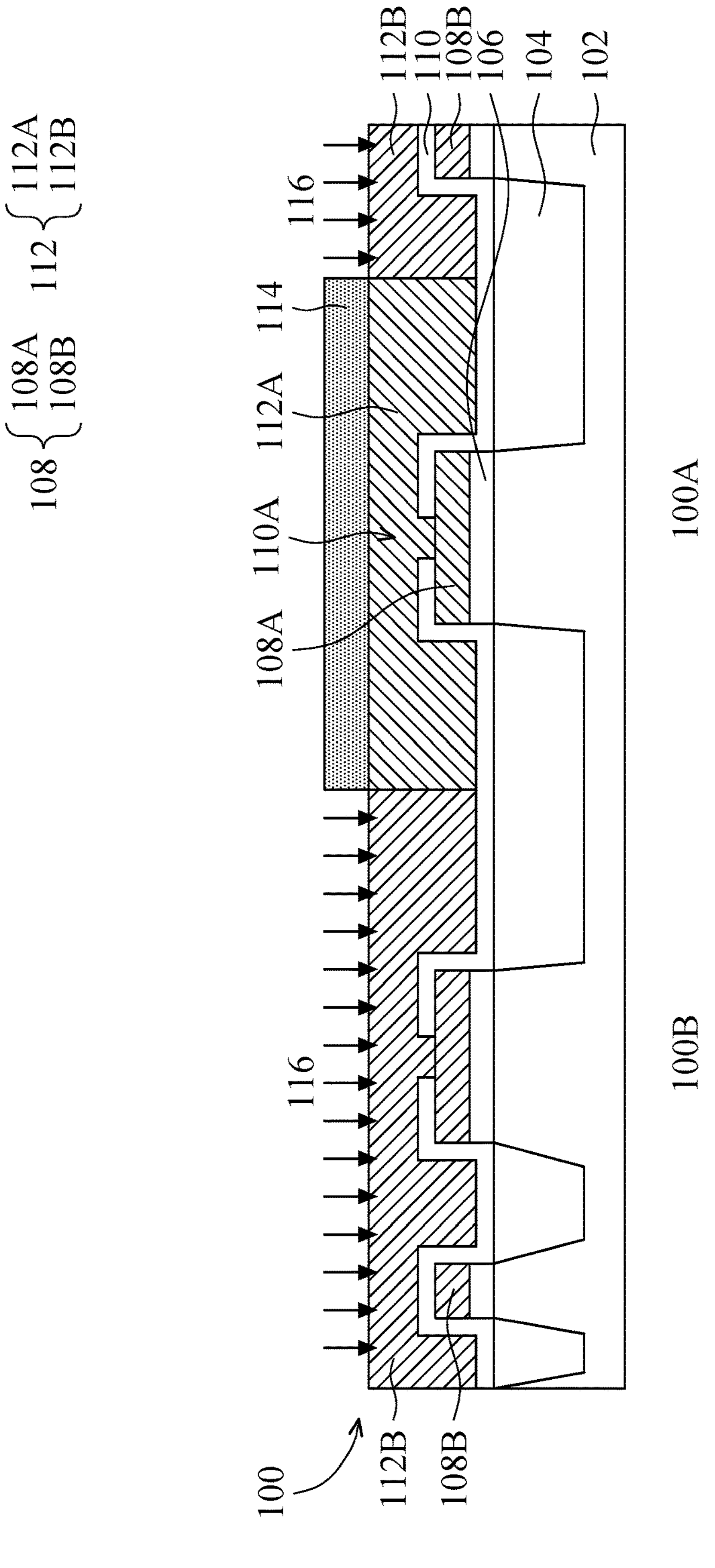
FIGS. 1A-1D are cross-sectional views illustrating various stages of forming a memory device according to some embodiments of the present disclosure.

Referring to FIG. 1A, the memory device 100 includes a substrate 102. The substrate 102 may use any suitable substrate material for a memory device, and may be a bulk semiconductor substrate or include a composite substrate formed of different materials. One or more semiconductor components (including active components and/or passive components) may be preformed on the substrate 102. To simplify the figures, only the flat substrate 102 is illustrated here. According to some embodiments, the substrate 102 has a memory array region and a peripheral circuit region, and only the peripheral circuit region is illustrated here.

An isolation structure 104 may be formed in the substrate 102. The isolation structure 104 may be formed by etching a trench in the substrate 102 using an etching process, and then filling the trench with the material of the isolation structure 104 by a deposition process. The deposition process may include chemical vapor deposition (CVD), plasma-enhanced chemical vapor deposition (PECVD), atomic layer deposition (ALD), the like, or a combination thereof. The material of the isolation structure 104 may include a dielectric material, including silicon oxide, silicon nitride, silicon oxynitride, the like, or a combination thereof. According to some embodiments, the isolation structure 104 includes a multi-layer structure, such as having a dielectric liner.

A gate dielectric layer 106 may be formed over the substrate 102. The gate dielectric layer 106 may be formed by a diffusion or deposition process, including a high temperature oxidation process, a wet oxidation process, CVD, PECVD, ALD, the like, or a combination thereof. The material of the gate dielectric layer 106 may include an oxide, such as silicon oxide, and may include any suitable materials.

A gate material layer having the first conductivity type may be formed over the gate dielectric layer 106. For example, a floating gate 108, an inter-gate dielectric layer 110, and a control gate 112 may be formed sequentially over the gate dielectric layer 106.

The floating gate 108 may be formed by a deposition process, including CVD, PECVD, ALD, the like, or a combination thereof. The material of the floating gate 108 may include any suitable material, such as polysilicon. The material of the floating gate 108 may be implanted with n-type or p-type dopants. The p-type dopant may be boron, for example. The n-type dopant may be phosphorus or arsenic, for example.

The inter-gate dielectric layer 110 may be sandwiched between the floating gate 108 and the control gate 112 and in directly contact with the floating gate 108 and the control gate 112. As shown in FIG. 1A, the inter-gate dielectric layer 110 covers the top surface and sidewalls of the floating gate 108 and extends to the top surface of the isolation structure 104. The inter-gate dielectric layer 110 may have one or more openings 110A exposing a portion of the floating gate 108.

The inter-gate dielectric layer 110 may be formed by a deposition process, including CVD, PECVD, ALD, the like, or a combination thereof. In some embodiments, the material of the inter-gate dielectric layer 110 may include any suitable material, such as an oxide-nitride-oxide structure, which has a silicon nitride layer sandwiched between two silicon oxide layers. In some other embodiments, the material of the inter-gate dielectric layer 110 may be a single layer of material, such as a single layer of oxide layer or nitride layer.

The control gate 112 may be disposed over the inter-gate dielectric layer 110 and extend through the opening 110A. In the opening 110A, the control gate 112 may be in contact with the floating gate 108. The control gate 112 may be formed by a deposition process, including CVD, PECVD, ALD, the like, or a combination thereof. The material of the control gate 112 may include a conductive material, such as polysilicon, and may be doped with n-type or p-type dopants. An annealing process can be performed to activate the implanted dopants.

Thereafter, a mask layer 114 may be formed over the control gate 112 to mask the memory array region (not shown) and a first portion 112A of the control gate 112 over a first region 100A of the substrate 102, and expose a second portion 112B of the control gate 112 over a second region 100B of the substrate 102. The second region 100B may surround the first region 100A. The mask layer 114 may include photoresist, hard mask, or a combination thereof, and may be a single-layer or multi-layer structure.

The mask layer 114 may be formed by a deposition process, a photolithography process, other suitable processes, or a combination thereof. In some embodiments, the deposition process includes spin coating, CVD, ALD, the like, or a combination thereof. For example, the photolithography process may include photoresist coating, soft baking, mask aligning, exposure, post-exposure baking, developing, rinsing, drying (such as hard baking), other suitable processes, or a combination thereof.

Next, different dopants may be used to perform an implantation process 116 on the floating gate 108 and the control gate 112, so that the exposed floating gate 108 and the exposed control gate 112 over the second region 100B may have the second conductivity type. The first conductivity type may be p-type and the second conductivity type may be n-type.

In particular, the first portion 108A of the floating gate 108 may have the first conductivity type, and the second portion 108B may have the second conductivity type. The first and second conductivity types may be different. The second portion 108B may surround the first portion 108A of the floating gate 108. The first portion 112A of the control gate 112 may have the first conductivity type, and the second portion 112B may have the second conductivity type. The second portion 112B may surround the first portion 112A of the control gate 112.

Figure 1B:
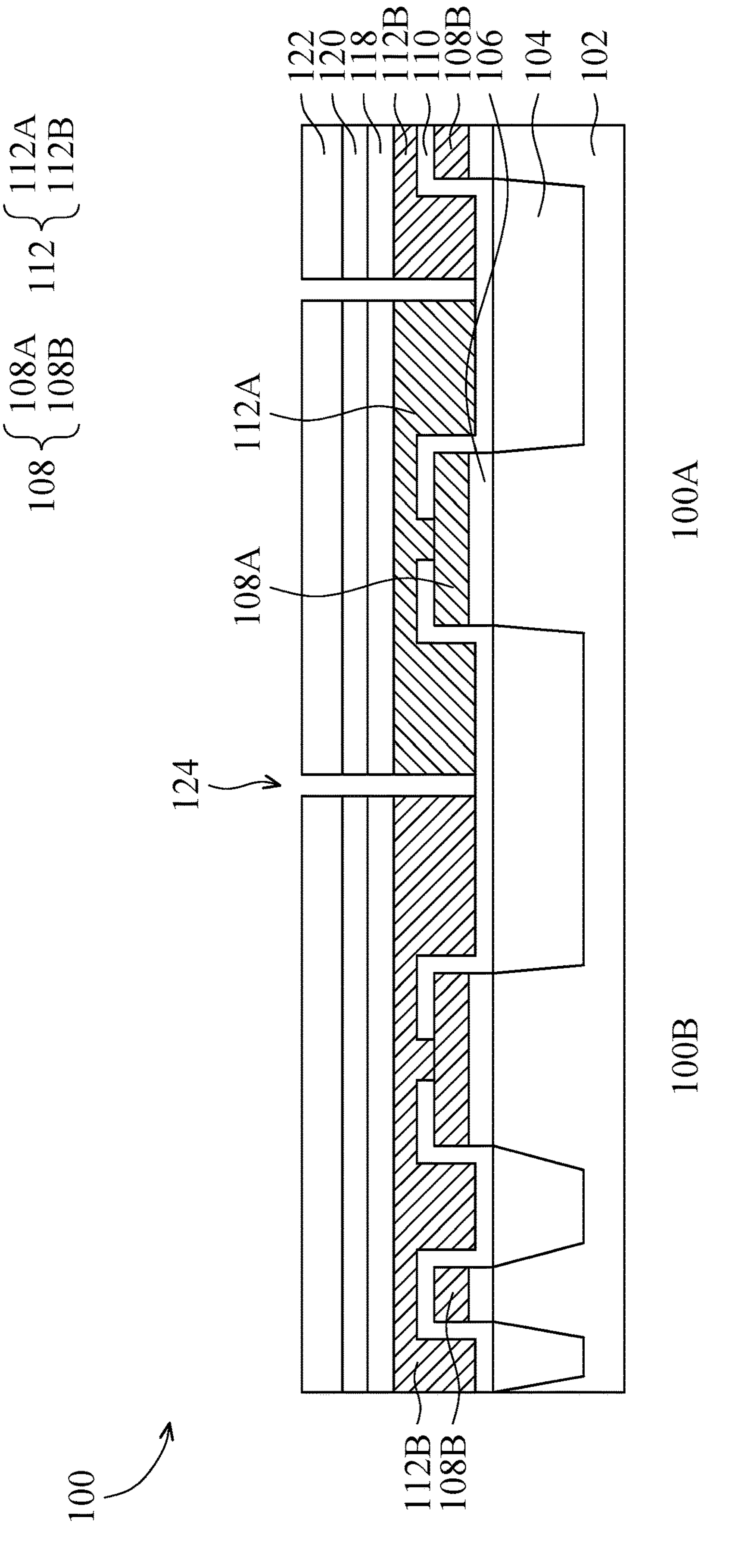

Thereafter, as shown in FIG. 1B, the mask layer 114 may be removed. Then, a metal gate 118 may be formed over the control gate 112. The metal gate 118 may be formed by a deposition process, including CVD, PECVD, ALD, the like, or a combination thereof. The material of the metal gate 118 may include a metal material, such as tungsten or any suitable material.

Thereafter, insulating films 120 and 122 may be formed over the metal gate 118. The insulating films 120 and 122 may be formed by the same or different deposition processes, including CVD, PECVD, ALD, the like, or a combination thereof. The materials of the insulating films 120 and 122 may include the same or different materials. For example, the material of the insulating film 120 may include a nitride (such as silicon nitride), and the material of the insulating film 122 may include an oxide (such as silicon oxide). In addition, two layers of the insulating films 120 and 122 are examples only, and the memory device 100 may also include more or fewer layers of insulating films.

Thereafter, a trench 124 may be formed through the insulating films 120, 122, the metal gate 118, and the control gate 112, and exposes a portion of the inter-gate dielectric layer 110. The trench 124 may be disposed directly over the isolation structure 104 and separate the first portion 112A of the control gate 112 having the first conductivity type from the second portion 112B of the control gate 112 having the second conductivity type. Therefore, dopant diffusion caused by subsequent heat treatment process to affect the gate stability of the memory device 100 can be avoided.

The trench 124 may be formed by disposing a mask layer (not shown) over the insulating film 122, and then using the mask layer as an etching mask to perform an etching process. The material and forming method of the mask layer may refer to the material and forming method of the mask layer 114 described above, and thus will not be repeated. The etching process may include a dry etching process, a wet etching process, or a combination thereof. For example, the dry etching process may include reactive ion etching (RIE), inductively-coupled plasma (ICP) etching, neutral beam etching (NBE), the like, or a combination thereof. For example, the wet etching process may use any suitable etchant, including hydrofluoric acid, ammonium hydroxide, or the like.

Figure 1C:
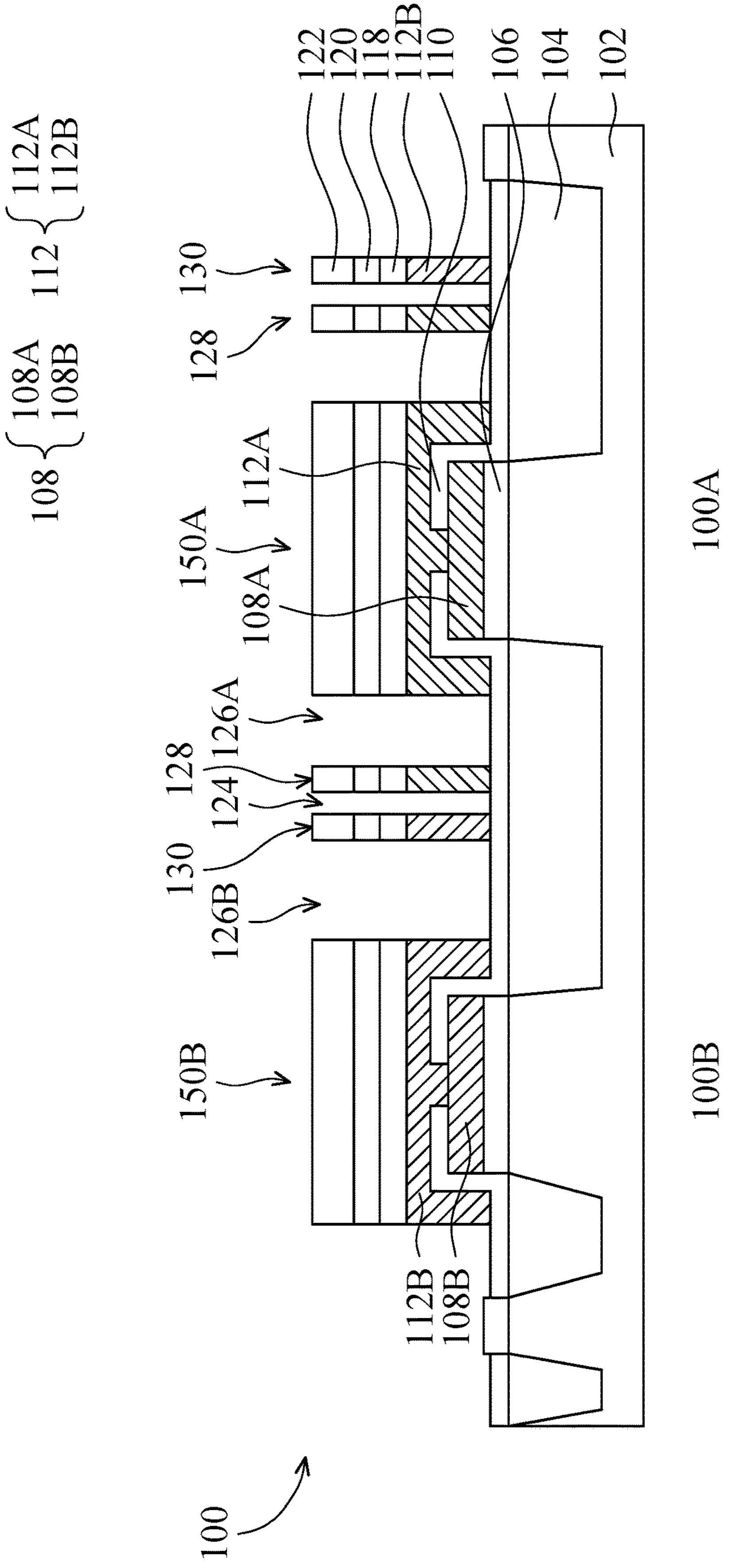

Thereafter, one or more heat treatments may be performed on the memory device 100. Then, as shown in FIG. 1C, a patterning process may be performed to form a first transistor 150A and a second transistor 150B over the first region 100A and the second region 100B of the substrate 100, respectively. The patterning process may include disposing a mask layer (not shown) over the insulating film 122, and then using the mask layer as an etching mask to perform the etching process. The examples of materials, forming methods, and etching process of the mask layer are as described above, and will not be repeated.

According to some embodiments, during the formation of the first transistor 150A and the second transistor 150B, trenches 126A and 126B are formed surrounding the first transistor 150A and the second transistor 150B, respectively. The trenches 126A and 126B may be formed in the same process. Therefore, the first guard ring 128 surrounding the first transistor 150A and the second guard ring 130 surrounding the first guard ring 128 can be formed simultaneously without additional processes. Additionally, the trenches 126A and 126B may expose a portion of the inter-gate dielectric layer 110.

According to some embodiments, the first guard ring 128 and the second guard ring 130 include the same material as the first transistor 150A and the second transistor 150B. In particular, the first guard ring 128 and the second guard ring 130 may each include portions of the control gate 112, the metal gate 118, and the insulating films 120, 122. For example, the first guard ring 128 and the second guard ring 130 may each include polysilicon, tungsten, nitride, and oxide. The first guard ring 128 and the second guard ring 130 may be disposed over the inter-gate dielectric layer 110 over the isolation structure 104.

As shown in FIG. 1C, the first guard ring 128 may be disposed over the first region 100A of the substrate 100 and may have the same first conductivity type as the first transistor 150A. The second guard ring 130 may be disposed over the second region 100B of the substrate 100 and may have the same second conductivity type as the second transistor 150B.

Figure 1D:
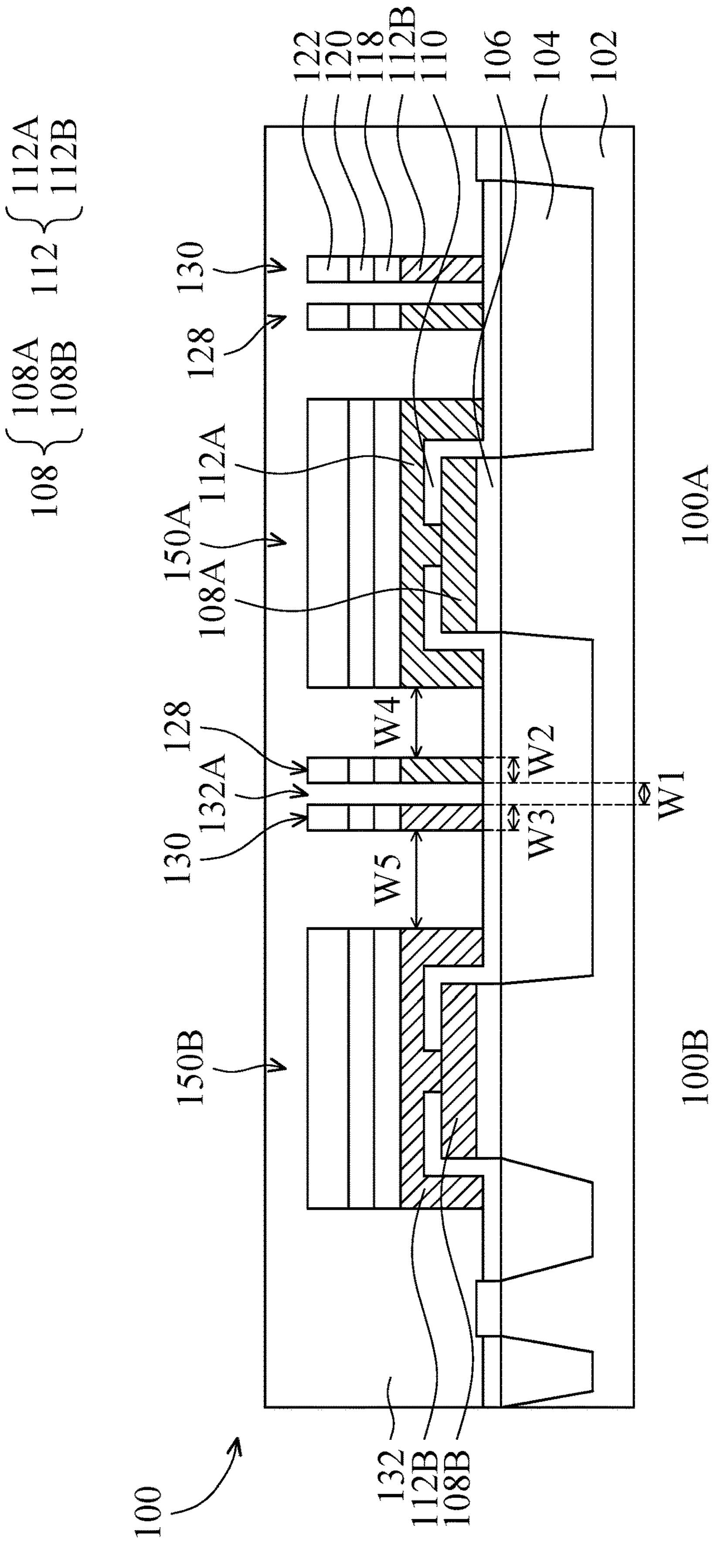

Thereafter, as shown in FIG. 1D, a dielectric layer 132 may be formed to cover the first transistor 150A, the second transistor 150B, the first guard ring 128, and the second guard ring 130, and may extend into the trenches 124, 126A, and 126B. The material of dielectric layer 132 may include dielectric materials, including silicon oxide, silicon nitride, silicon oxynitride, the like, or a combination thereof. The dielectric layer 132 may be formed by any suitable deposition process, including CVD, PECVD, ALD, the like, or a combination thereof.

The dielectric layer 132 in the trench 124 may form a dielectric guard ring 132A that separates the first guard ring 128 and the second guard ring 130. In a direction that is parallel to the top surface of substrate 102, the width W1 of the dielectric guard ring 132A may be substantially equal to the width W2 of the first guard ring 128. For example, the ratio of the width W1 of the dielectric guard ring 132A to the width W2 of the first guard ring 128 may be in a range of about 0.9 to about 1.1, such as about 1. Similarly, the width W1 of the dielectric guard ring 132A may be substantially equal to the width W3 of the second guard ring 130. For example, a ratio of the width W1 of the dielectric guard ring 132A to the width W3 of the second guard ring 130 may be in a range of about 0.5 to about 2, such as about 1.

The width W2 of the first guard ring 128 may be substantially equal to the width W3 of the second guard ring 130. For example, a ratio of the width W2 of the first guard ring 128 to the width W3 of the second guard ring 130 may be in a range of about 0.8 to about 1.2, such as about 1.

The first guard ring 128 and the first transistor 150A may be separated by a width W4, which may be greater than the width W1 of the dielectric guard ring 132A, may be greater than the width W2 of the first guard ring 128, and may be greater than the width W3 of the second guard ring 130. The second guard ring 130 and the second transistor 150B may be separated by a width W5, which may be greater than the width W1 of the dielectric guard ring 132A, may be greater than the width W2 of the first guard ring 128, and may be greater than the width W3 of the second guard ring 130.

Figure 2:
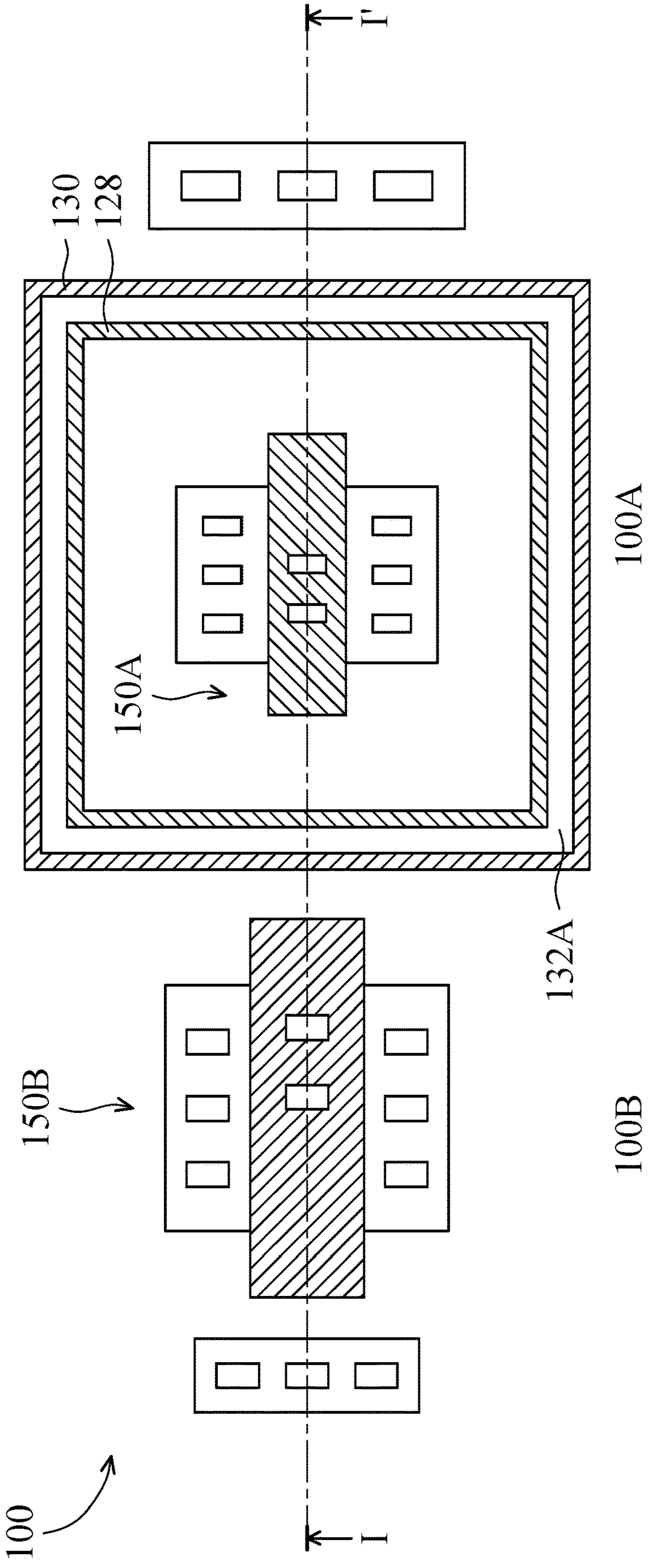
FIG. 2 is a top view illustrating a memory device according to some embodiments of the present disclosure.

FIG. 2 is a top view illustrating a memory device 100 according to some embodiments of the present disclosure. The memory device 100 in FIG. 1D may be a cross-sectional view taken along a line I-I' shown in FIG. 2. To simplify the figures, only a portion of the memory device 100 is illustrated. As shown in FIG. 2, the dielectric guard ring 132A may surround the first guard ring 128, and the second guard ring 130 may surround the dielectric guard ring 132A.

In the above embodiments, by disposing the trench 124 (i.e., the dielectric guard ring 132A) so that it surrounds the first transistor 150A, defects caused by dopant diffusion during the heat treatment process (which may affect the gate stability of the first transistor 150A) can be avoided.

Figure 3:
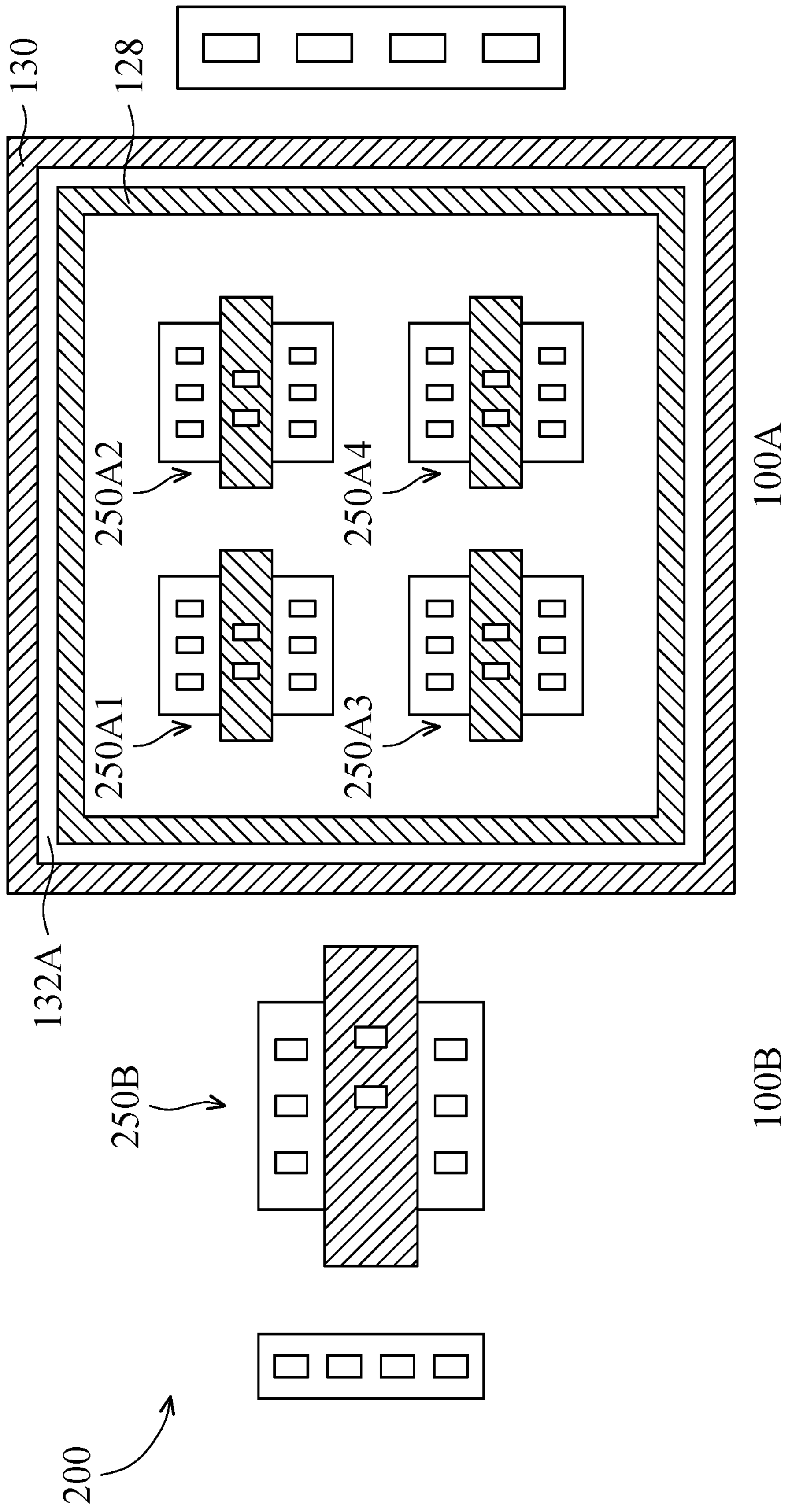
FIG. 3 is a top view illustrating a memory device according to anther embodiments of the present disclosure.

FIG. 3 is a top view illustrating a memory device 200 according to anther embodiments of the present disclosure. Additional features may be added to the memory device 200. Some of the features described below may be replaced or eliminated for different embodiments. To simplify the figures, only a portion of the memory device 200 is illustrated. In the following embodiments, the memory device 200 includes more than two transistors.

According to some embodiments, as shown in FIG. 3, the memory device 200 includes transistors 250A1, 250A2, 250A3, 250A4 disposed over the first region 100A of the substrate and a transistor 250B disposed over the second region 100B of the substrate. The transistors 250A1, 250A2, 250A3, 250A4 may have the first conductivity type, and the transistor 250B may have the second conductivity type. The first and second conductivity types may be different. The first conductivity type may be p-type and the second conductivity type may be n-type.

According to some embodiments, the memory device 200 includes a first guard ring 128 surrounding the transistors 250A1, 250A2, 250A3, 250A4, a dielectric guard ring 132A surrounding the first guard ring 128, and a second guard ring 130 surrounding the first guard ring 128. The first guard ring 128 may be disposed over the first region 100A of the substrate and may have the first conductivity type. The second guard ring 130 may be disposed over the second region 100B of the substrate and may have the second conductivity type.

In the above embodiments, by disposing the dielectric guard ring 132A around the transistors 250A1, 250A2, 250A3, 250A4, defects caused by dopant diffusion during the heat treatment process (which may affect gate stability) can be avoided.

In summary, the memory device provided by the embodiments of the present disclosure includes a dielectric guard ring to separate transistors having different conductivity types, thereby avoiding dopant diffusion caused by subsequent heat treatment, thus improving gate stability.

Although the present disclosure is described by way of example and according to preferred embodiments, it should be understood that the present disclosure is not limited to the disclosed embodiments. On the contrary, the present disclosure is intended to cover various variations and similar arrangements that are apparent to those skilled in the art. Accordingly, the appended claims should be given the broadest possible interpretation to cover all such variations and similar arrangements.

What is claimed is:

1. A memory device, comprising:

a substrate having a first region and a second region which are adjacent;

an isolation structure embedded in the substrate;

a first transistor disposed over the first region of the substrate and having a first conductivity type;

a second transistor disposed over the second region of the substrate and having a second conductivity type which is different from the first conductivity type;

a first guard ring disposed over the first region of the substrate and surrounding the first transistor, wherein the first guard ring comprises the same material as the first transistor and has the first conductivity type; and a dielectric guard ring disposed over the substrate and surrounding the first guard ring.

2. The memory device as claimed in claim 1, wherein the first guard ring is disposed over the isolation structure.

3. The memory device as claimed in claim 1, wherein the first guard ring and the first transistor comprise polysilicon.

4. The memory device as claimed in claim 1, further comprising:

a second guard ring disposed over the isolation structure and surrounding the dielectric guard ring, wherein the second guard ring comprises polysilicon.

5. The memory device as claimed in claim 4, wherein the second guard ring is disposed over the second region of the substrate and has the second conductivity type.

6. The memory device as claimed in claim 4, wherein a width of the second guard ring is substantially equal to a width of the first guard ring in a direction parallel to a top surface of the substrate.

7. The memory device as claimed in claim 1, further comprising:

a third transistor adjacent to the first transistor and having the first conductivity type, wherein the first guard ring surrounds the third transistor.

8. The memory device as claimed in claim 1, wherein the first transistor comprises a floating gate, an inter-gate dielectric layer, and a control gate, and the first guard ring is disposed over the inter-gate dielectric layer.

9. The memory device as claimed in claim 1, wherein in a direction parallel to a top surface of the substrate, a width of the dielectric guard ring is substantially equal to a width of the first guard ring.

10. The memory device as claimed in claim 1, wherein the first transistor and the second transistor are both located in a peripheral circuit region.

* * * * *